(12) United States Patent
Lee et al.

(10) Patent No.: US 10,825,703 B2
(45) Date of Patent: Nov. 3, 2020

(54) CHUCK STAGE PARTICLE DETECTION DEVICE

(71) Applicant: SAMSUNG ELECTRONICS CO., LTD., Suwon-si (KR)

(72) Inventors: Mu Yer Lee, Hwaseong-si (KR); Hyo Bum Kang, Hwaseong-si (KR); Jun Sung Lee, Hwaseong-si (KR); Jae Lyang Jung, Yongin-si (KR); Young Min Hur, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 326 days.

(21) Appl. No.: 15/867,068

(22) Filed: Jan. 10, 2018

(65) Prior Publication Data

US 2018/0323094 A1   Nov. 8, 2018

(30) Foreign Application Priority Data

May 2, 2017   (KR) .......................... 10-2017-0056107

(51) Int. Cl.
*H01L 21/67* (2006.01)
*H01L 21/683* (2006.01)

(52) U.S. Cl.
CPC .... *H01L 21/67288* (2013.01); *H01L 21/6838* (2013.01)

(58) Field of Classification Search
CPC ......... H01L 21/67288; H01L 21/67259; H01L 21/27265; H01L 21/67242; H01L 21/6838
USPC ............ 73/37, 28.01, 28.03, 28.04, 865.866, 73/432.1; 206/710, 711, 712; 269/21
See application file for complete search history.

(56) References Cited

U.S. PATENT DOCUMENTS

| 5,796,486 A * | 8/1998 | Jacob ................ H01L 21/67259 118/675 |
| 8,616,539 B2 | 12/2013 | Tseng et al. |
| 9,022,392 B2 | 5/2015 | Jang et al. |

(Continued)

FOREIGN PATENT DOCUMENTS

| JP | 60146673 | * | 8/1985 |
| JP | 2008172170 | | 7/2008 |

(Continued)

*Primary Examiner* — Robert R Raevis
(74) *Attorney, Agent, or Firm* — F. Chau & Associates, LLC

(57) ABSTRACT

A particle detection device includes a chuck stage on which a wafer is configured to be seated, first and second adsorption holes shaped as closed concentric curves passing through the chuck stage, a first adsorption module connected to the first adsorption hole under the chuck stage and configured to provide a vacuum pressure, a second adsorption module connected to the second adsorption hole under the chuck stage and configured to provide a vacuum pressure, a pressure gauge configured to measure vacuum pressures of the first and second adsorption holes and a detection module configured to receive the vacuum pressures of the first and second adsorption holes from the pressure gauge and detect whether the wafer is fixed or not and whether particle is present or not, based on the received vacuum pressures. The first and second adsorption modules sequentially provide the vacuum pressure to the first and second adsorption holes.

20 Claims, 11 Drawing Sheets

(56) References Cited

U.S. PATENT DOCUMENTS

| | | | | |
|---|---|---|---|---|
| 2006/0166382 | A1* | 7/2006 | Kim | H01L 22/20 |
| | | | | 438/14 |
| 2007/0158031 | A1 | 7/2007 | Miyake | |
| 2010/0013169 | A1* | 1/2010 | Monteen | H01L 21/6838 |
| | | | | 279/3 |
| 2018/0284071 | A1* | 10/2018 | Wright | G01N 29/223 |

FOREIGN PATENT DOCUMENTS

| | | |
|---|---|---|
| KR | 1020070000658 | 1/2007 |
| KR | 10-0776497 | 11/2007 |
| KR | 1020080080775 | 9/2008 |
| KR | 10-2011-0017671 | 2/2011 |

* cited by examiner

CHUCK STAGE PARTICLE DETECTION DEVICE

CROSS-REFERENCE TO RELATED APPLICATION

This application claims priority to Korean Patent Application No. 10-2017-0056107 filed on May 2, 2017 in the Korean Intellectual Property Office, and all the benefits accruing therefrom under 35 U.S.C. 119, the disclosure of which is incorporated by reference in its entirety herein.

BACKGROUND

1. Technical Field

The present disclosure relates to a chuck stage particle detection device.

2. Discussion of Related Art

Probe equipment for testing a wafer loads the wafer on a chuck stage, and brings a probe card into contact with the wafer to perform the testing. When particles are positioned between the wafer and the chuck stage, the wafer may become damaged when the probe card has a sharp edge.

Such particles may be present, particularly when particles from line processing are attached to a lower end of the wafer during loading of the wafer and introduced, or when particles generated inside the equipment are attached to an upper surface of the chuck stage. That is, due to particles introduced between the chuck stage and the wafer, the wafer may break when the probe card and the wafer are brought into contact with each other, or quality of a semiconductor pattern formed on the wafer may degrade.

Accordingly, an operation for detecting particles on the chuck stage is necessary.

SUMMARY

According to an exemplary embodiment of the present inventive concept, there is provided a chuck stage particle detection device, including a chuck stage on which a wafer is configured to be seated, a first adsorption hole passing through the chuck stage, in which a plane cross-section of the first adsorption hole is a first closed curve, a second adsorption hole passing through the chuck stage, in which a plane cross-section of the second adsorption hole is a second closed curve, and the first closed curve is positioned within the second closed curve, a first adsorption module connected to the first adsorption hole under the chuck stage and configured to provide a vacuum pressure, a second adsorption module connected to the second adsorption hole under the chuck stage and configured to provide a vacuum pressure, a pressure gauge configured to measure vacuum pressures of the first and second adsorption holes and a detection module configured to receive the vacuum pressures of the first and second adsorption holes from the pressure gauge and detect whether the wafer is fixed or not and whether a particle is present or not based on the received vacuum pressures, wherein the first and second adsorption modules sequentially provide the vacuum pressure to the first and second adsorption holes.

According to an exemplary embodiment of the present inventive concept, there is provided a chuck stage particle detection device, including a chuck stage on which a wafer is configured to be seated, and having a center region, a plurality of adsorption holes passing through the chuck stage, exposed to an upper surface of the chuck stage and adsorbing the wafer onto the upper surface of the chuck stage, wherein the plurality of adsorption holes are positioned at different distances from the center region of the chuck stage, a pressure gauge configured to measure adsorption pressure of the plurality of adsorption holes, an adsorption module configured to provide a vacuum pressure to the adsorption holes, wherein the adsorption module provides the vacuum pressure sequentially to the plurality of adsorption holes in an order from the adsorption holes positioned closer to the center region to the adsorption holes positioned farther from the center region and a detection module configured to receive the adsorption pressure from the pressure gauge and detect a presence or absence of particle, based on the received measured adsorption pressures.

According to an exemplary embodiment of the present inventive concept, there is provided a chuck stage particle detection device, including a chuck stage on which a wafer is seated, and having first and second regions disposed in different positions from each other, a first adsorption hole passing through the chuck stage and positioned in the first region, a second adsorption hole passing through the chuck stage and positioned in the second region, a pressure gauge configured to measure adsorption pressures of the first and second adsorption holes, an adsorption module configured to provide vacuum pressure sequentially to the first and second adsorption holes and a detection module configured to receive the adsorption pressure from the pressure gauge and detect a presence or absence of a particle, from the received measured adsorption pressures.

According to an exemplary embodiment of the present inventive concept, there is provided a chuck stage particle detection device, including a chuck stage on which a wafer is configured to be seated, a plurality of concentric ring shaped adsorption holes passing through the chuck stage, an adsorption module configured to sequentially provide a vacuum pressure to the adsorption holes, a pressure gauge configured to measure pressures at the adsorption holes, and a detection module configured to detect a particle between the wafer and the chuck stage when a first measured pressure of the measured pressures is greater than a second measured pressure of the measured pressures, and the first and second measured pressures are less than a threshold.

BRIEF DESCRIPTION OF THE DRAWINGS

The present invention will become more apparent to those of ordinary skill in the art by describing in detail exemplary embodiments thereof with reference to the accompanying drawings.

DETAILED DESCRIPTION

A method for fabricating a chuck stage particle detection device according to an exemplary embodiment of the inventive concept will be described with reference to FIGS. 1 to 7.

Figure 1:
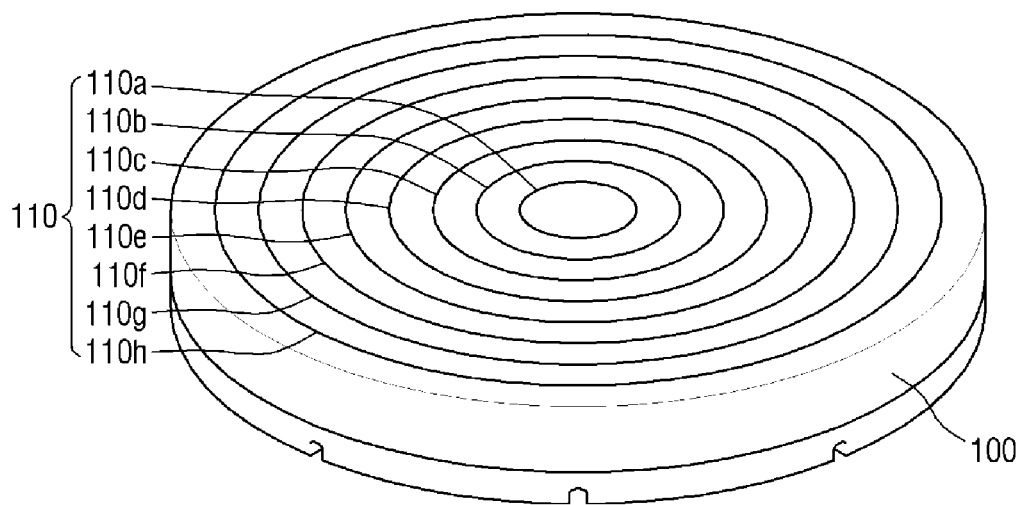
FIG. 1 is a perspective view provided to explain a chuck stage particle detection device according to an exemplary embodiment of the inventive concept.
Figure 2:
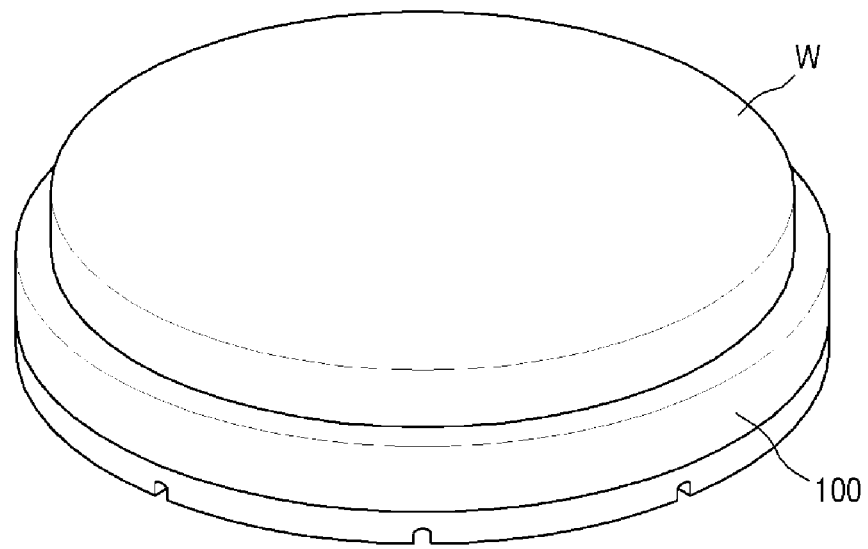
FIG. 2 is a perspective view provided to explain a wafer being seated on the chuck stage of FIG. 1.
Figure 3:
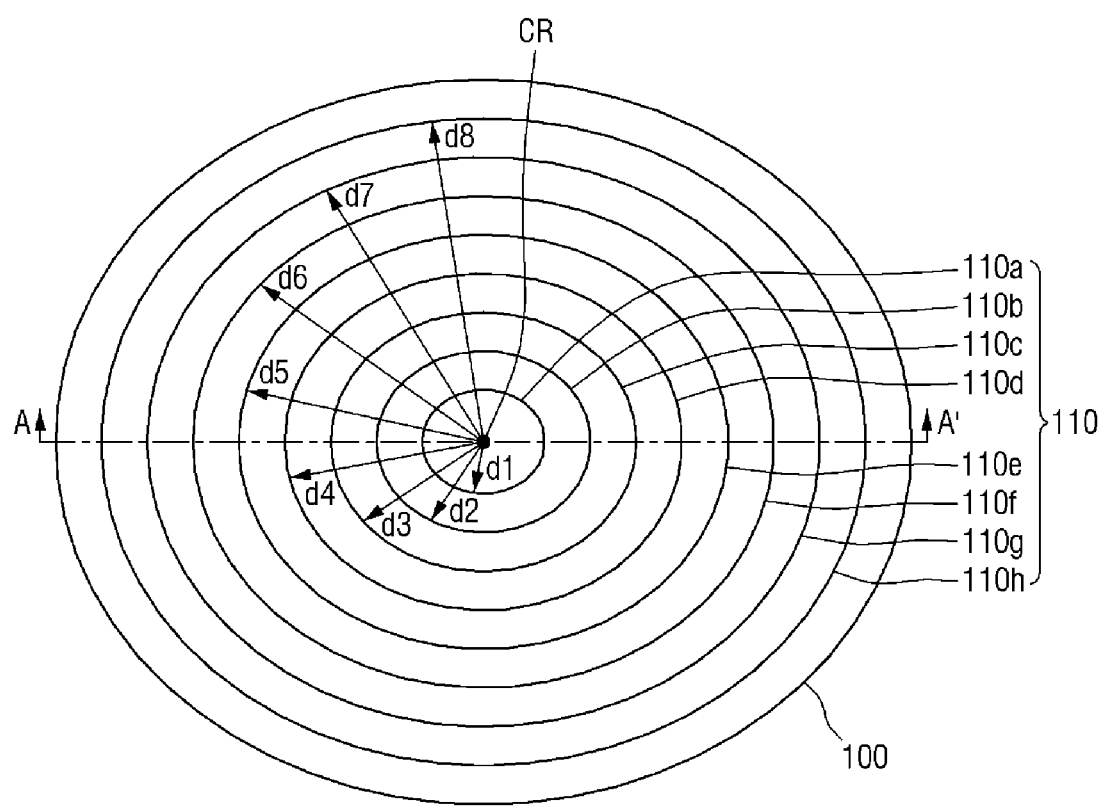
FIG. 3 is a top view provided to explain the chuck stage particle detection device of FIG. 1 in detail.
Figure 4:
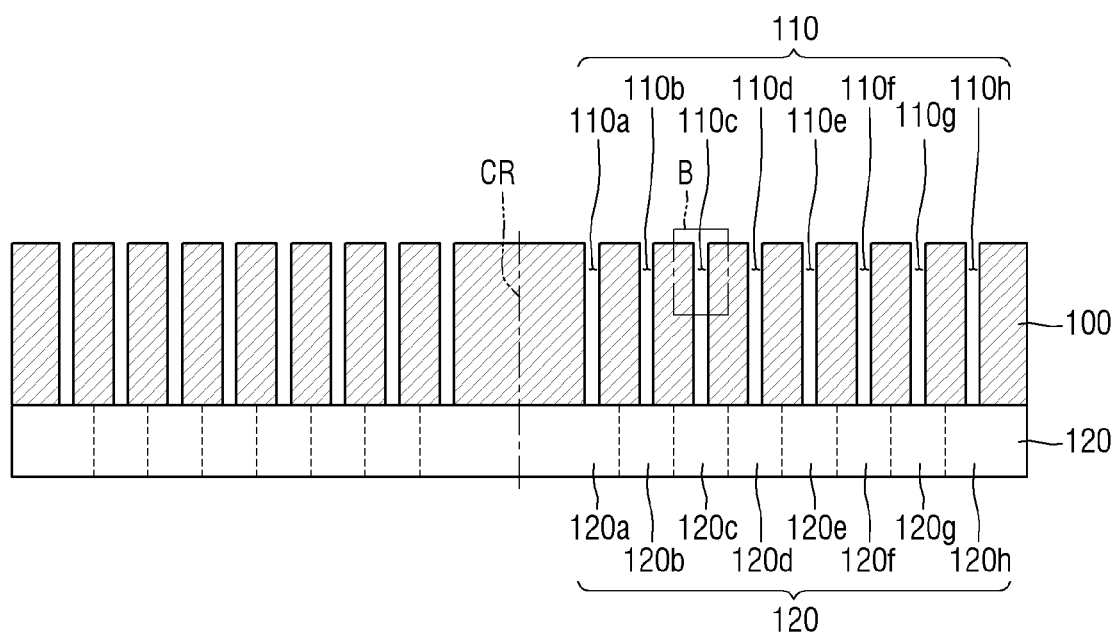
FIG. 4 is a partial cross-sectional view taken on line A-A' provided to explain the chuck stage particle detection device of FIG. 1 in detail.
Figure 5:
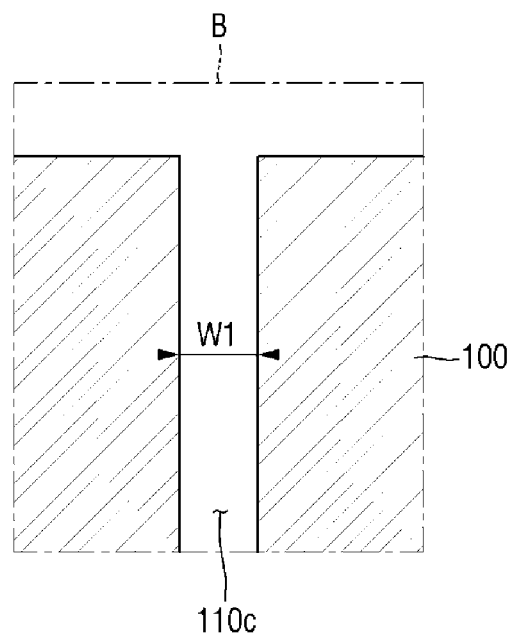
FIG. 5 is an enlarged cross-sectional view provided to explain an encircled section B of FIG. 4 in detail.
Figure 6:
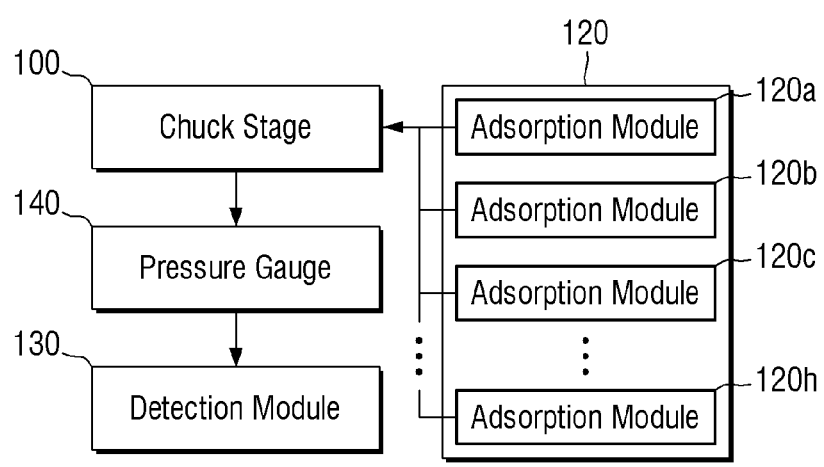
FIG. 6 is a block diagram provided to explain the chuck stage particle detection of FIG. 1.
Figure 7:
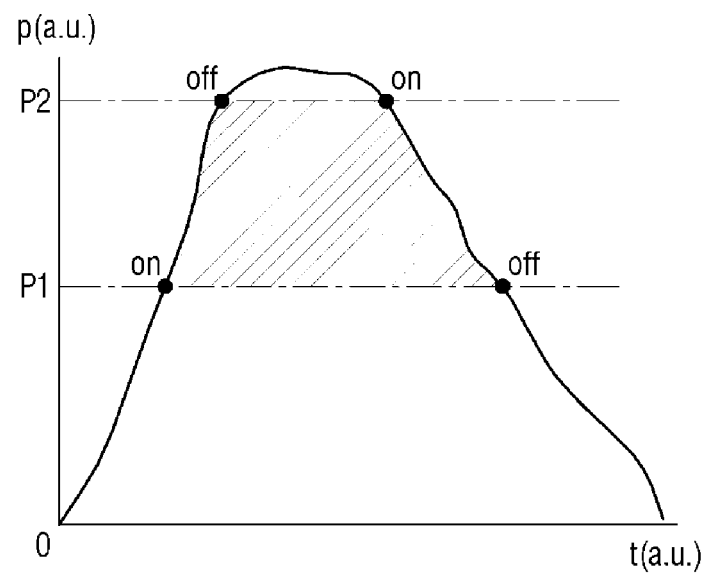
FIG. 7 is a graph provided to explain a window segmentation mode of a chuck stage particle detection device according to an exemplary embodiment of the inventive concept.

FIG. 1 is a perspective view provided to explain a chuck stage particle detection device according to an exemplary embodiment of the inventive concept, and FIG. 2 is a perspective view provided to explain a wafer being seated (e.g., disposed) on the chuck stage of FIG. 1. FIG. 3 is a top view provided to explain the chuck stage particle detection device of FIG. 1 in detail, and FIG. 4 is a partial cross-sectional view taken on line A-A' provided to explain the chuck stage particle detection device of FIG. 1 in detail. FIG. 5 is an enlarged cross-sectional view provided to explain an encircled section B of FIG. 4 in detail, and FIG. 6 is a block diagram provided to explain the chuck stage particle detection device of FIG. 1. FIG. 7 is a graph provided to explain window segmentation mode of a chuck stage particle detection device according to an exemplary embodiment of the inventive concept.

Referring to FIGS. 1 to 7, the chuck stage particle detection device according to an exemplary embodiment includes a chuck stage 100, an adsorption hole 110, an adsorption module 120 (e.g., a device configured to provide vaccum pressure), a pressure gauge 140 and a detection module 130 (e.g., a detection circuit).

The wafer W may be seated on an upper surface of the chuck stage 100. The chuck stage 100 is used to perform a test on the wafer W. In an embodiment, the chuck stage 100 has a flat upper surface so that the wafer W can be stably seated. While FIG. 1 illustrates that the chuck stage 100 has a cylindrical outer surface, embodiments of the inventive concept are not limited thereto.

The chuck stage 100 includes the adsorption hole 110, the adsorption module 120, the pressure gauge 140 and the detection module 130. However, exemplary embodiments of the inventive concept are not limited thereto. For example, in alternate embodiments of the inventive concept, some of the elements mentioned above are not positioned directly inside the chuck stage 100, but are positioned outside and connected to the chuck stage 100.

When the wafer W is seated on an upper surface of the chuck stage, the chuck stage may be rotated in a clockwise or a counterclockwise direction. Alternatively, the chuck stage 100 may move in three axes (XYZ) to adjust a position of the wafer for a subsequent test process.

The chuck stage 100 includes a center region CR. The center region CR may have a circle shape or an oval shape. The center region CR may refer to a center on a plane shape of the chuck stage 100. In an alternate embodiment when the chuck stage 100 does not have a circle or oval shape, the center region CR is still defined.

The adsorption hole 110 passes through the chuck stage 100. The adsorption hole 110 may assist in fixing the wafer W onto an upper surface of the chuck stage 100 when vacuum pressure is provided by the adsorption module 120.

A plurality of adsorption holes 110 may be provided. For example, the adsorption holes 110 may include first to eighth adsorption holes 110a-110h. However, exemplary embodiments of the inventive concept are not limited to the example given above. That is, while it is illustrated that there are 8 adsorption holes 110, there may be fewer or greater than 8 adsorption holes in alternate embodiments.

In an embodiment, a plane shape of each adsorption hole 110 is a closed curve. Further, a plane shape of each adsorption hole 110 may be a circle or an oval. The first adsorption hole 110a may be spaced apart from the center region CR of the chuck stage 100 by a first distance d1. The first adsorption hole 110a may surround the center region CR.

The second adsorption hole 110b may then be formed to surround the first adsorption hole 110a. That is, when viewed in a plane shape, a circle or an oval forming the first adsorption hole 110a may be formed within a circle or an oval forming the second adsorption hole 110b. The second adsorption hole 110b may be spaced apart from the center region CR by a second distance d2. In this example, the second distance d2 may be greater than the first distance d1.

With the above method, the first to eighth adsorption holes 110a-110h may be positioned at first to eighth distances d1-d8 from the center region CR, respectively. That is, the plane shapes of the first to eighth adsorption holes 110a-110h may be circle or oval shapes that include circles or ovals formed by respective preceding adsorption holes. That is, a plane shape of the eighth adsorption hole 110h may be a circle or an oval that includes a plane shape of the first to seventh adsorption holes 110a-110g.

Referring to FIG. 2, the wafer W may be seated on an upper surface of the chuck stage 100. In this example, the wafer W may overlie all of the first to eighth adsorption holes 110a-110h. That is, the first to eighth adsorption holes 110a-110h may be directly in contact with a lower surface of the wafer W. For example, the wafer W may entirely cover the first to eighth adsorption holes 110a-110h.

According to a size of the wafer W, only some of the first to eighth adsorption holes 110a-110h may be directly in contact with a lower surface of the wafer W. For example, some of the adsorption holes may be exposed based on the size of the wafer W.

Although FIG. 3 illustrates each plane shape of the chuck stage 100 and the adsorption hole 110 as an oval shape, the inventive concept is not limited thereto and accordingly, the plane shape may be also a circle shape.

The adsorption module 120 may be connected to the adsorption hole 110 to provide vacuum pressure to the adsorption hole 110. The adsorption module 120 may provide vacuum pressure to the first to eighth adsorption holes 110a-110h sequentially. For example, the adsorption module 120 may provide vacuum pressure initially to the first adsorption hole 110a, and provide vacuum pressure lastly to the eighth adsorption hole 110h. Alternatively, the adsorption module 120 may provide vacuum pressure first to the eighth adsorption hole 110h, and provide vacuum pressure lastly to the first adsorption hole 110a.

In this example, the adsorption module 120 may be one single adsorption module 120 sequentially connected to the first to eighth adsorption holes 110a-110h and providing vacuum pressure sequentially, as described above. Alternatively, according to some exemplary embodiments, the adsorption module 120 may include discrete first to eighth adsorption modules 120a-120h.

For example, the first adsorption module 120a may be connected to the first adsorption hole 110a to provide vacuum pressure to the first adsorption hole 110a, the second adsorption module 120b may provide vacuum pressure to the second adsorption hole 110b, etc. With the above method, the first to eighth adsorption modules 120a-120h may provide vacuum pressure to the first to eighth adsorption holes 110a-110h, respectively. In this case, the first to eighth adsorption modules 120a-120h may be sequentially driven, thus naturally providing vacuum pressure to the first to eighth adsorption holes 110a-110h.

Referring to FIG. 5, the adsorption hole 110 has a certain width W1. Although the drawing only illustrates the third adsorption hole 110c, the other adsorption holes 110 may have the same shape. For convenience, the following description refers to the third adsorption hole 110c only.

The third adsorption hole 110c has a first width W1. In this example, the first width W1 is a width measured in a direction extending from the center region CR to the third adsorption hole 110c. In an embodiment, the third adsorption hole 110c forms a closed curve on a plane, and a width of the hole forming the closed curve is always the first width W1. For example, the width of the hole may be uniform. This may allow the wafer W to be evenly fixed, to thus prevent a specific portion of the wafer W from being affected by an excessive force.

Referring to FIG. 6, the adsorption module 120 is configured to provide vacuum pressure to the adsorption hole 110 of the chuck stage 100.

The pressure gauge 140 may measure pressure at the adsorption hole 110 of the chuck stage 100. In this example, pressure of the adsorption hole 110 may be entirely measured. That is, instead of measuring pressure of the first to eighth adsorption holes 110a-110h separately, pressure may be entirely measured. To that end, portions connected to the first to eighth adsorption holes 110a-110h may be provided so that pressure may be measured from the portions. Alternatively, pressure may be measured separately in the first to eighth adsorption holes and calculated on a software level to thus provide measurement of the overall pressure. For example, the pressure gauge 140 may include a pressure sensor for each adsorption hole that collects a distinct pressure measurement, and the pressure gauge 140 may calculate the overall pressure using the distinct pressure measurements.

When the vacuum pressure is provided sequentially to the first to eighth adsorption holes 110a-110h by the adsorption module 120, pressure varies according to time. Thus, the pressure gauge 140 may measure pressure which varies according to time.

In an embodiment, the pressure gauge 140 delivers the measured pressure to the detection module 130.

The detection module 130 may receive the measured pressure of the adsorption hole 110 from the pressure gauge 140. In an embodiment, the detection module 130 is configured to determine whether the wafer W is fixed onto the chuck stage 100 based on the delivered pressure. For example, if the measured pressure is above a threshold, the detection module 130 may conclude that the wafer W is fixed, and otherwise is not fixed.

In an embodiment, the detection module 130 is configured to detect the presence or absence of one or more particles using the measured pressure delivered from the pressure gauge 140.

The detection module 130 may determine whether the chuck stage 100 of the wafer W is fixed or not, and determine the presence or absence of particles using various methods. For example, the detection module 130 may used a window segmentation method or a hysteresis method.

Referring to FIG. 7, the window segmentation method will be explained first.

Referring to FIG. 7, the detection module 130 uses a reference pressure which has been previously determined or defined. The reference pressure may include a first reference pressure P1 and a second reference pressure P2. In an embodiment, the first reference pressure P1 is less than the second reference pressure P2.

The detection module 130 may include an on-mode and an off-mode. In an embodiment, the 'on-mode' means that the wafer W is fixed onto the chuck stage 100 and no particle is present. In an embodiment, the 'off-mode' means that the wafer W is not fixed onto the chuck stage 100 and a particle is present.

In an embodiment, the detection module 130 operates in the on-mode when the pressure measured with the pressure gauge 140 is between the first reference pressure P1 and the second reference pressure P2, and operates in the off-mode in a range other than the above. For example, the detection module 130 may operate in the off-mode when the measured pressure is less than the first reference pressure P1 or greater than the second reference pressure P2.

That is, the overall pressure of the adsorption hole 110 may increase when the adsorption module 120 begins to provide vacuum pressure to the adsorption hole 110. Then when the overall pressure becomes equal to, or greater than the first reference pressure P1, the detection module 130 may operate in the on-mode.

Next, when the overall pressure continues to go up and becomes the second reference pressure P2 or above, the detection module 130 may enter the off-mode. When vacuum pressure continues to go up and arrives at a certain vacuum pressure, the wafer W is determined to be already fixed onto the chuck stage 200, so as to reduce power consumption and prevent the wafer W from being exerted under too much pressure.

That is, the adsorption module 120 ceases applying pressure in the off-mode, so that the overall pressure may decrease. When the overall pressure falls again down to the second reference pressure P2 or below, the detection module 130 may enter the off-mode again.

In this example, the off-mode may indicate that the detection module 130 has detected a particle. As vacuum pressure is sequentially provided to each adsorption hole 110 by the adsorption module 120, the overall pressure of the adsorption hole 110 may continuously vary according to time. After a certain time elapses, the overall pressure of the adsorption hole 110 may be stabilized, and accordingly, it may now be determined whether the wafer W is fixed onto the chuck stage 100 or not and whether a particle is present or not, by the on-mode and the off-mode of the detection module 130.

The first reference pressure P1 and the second reference pressure P2 may be previously-set values which are adjustable. Accordingly, the optimum first reference pressure P1 and second reference pressure P2 may be searched and set after several repetitions.

The first reference pressure P1 and the second reference pressure P2 may be selected by considering the following factors, respectively. In an embodiment, the first reference pressure P1 is set by considering the degree of pressure drop that occurs due to the presence or absence of a particle. In an embodiment, the second reference pressure P2 is selected within a pressure range irrelevant to the particle, by considering the degree of pressure that can completely fix the wafer W onto the chuck stage 100. As a result, determination as to the presence or absence of a particle may depend on the second reference pressure P2.

The chuck stage particle detection device according to an exemplary embodiment operates in the window segmentation mode to prevent power consumption under a certain pressure or higher, and also may detect whether the wafer is fixed or not and whether a particle is present or not, by using a reference pressure.

A chuck stage particle detection device according to an exemplary embodiment of the inventive concept will be described below with reference to FIGS. 6 and 8.

Figure 8:
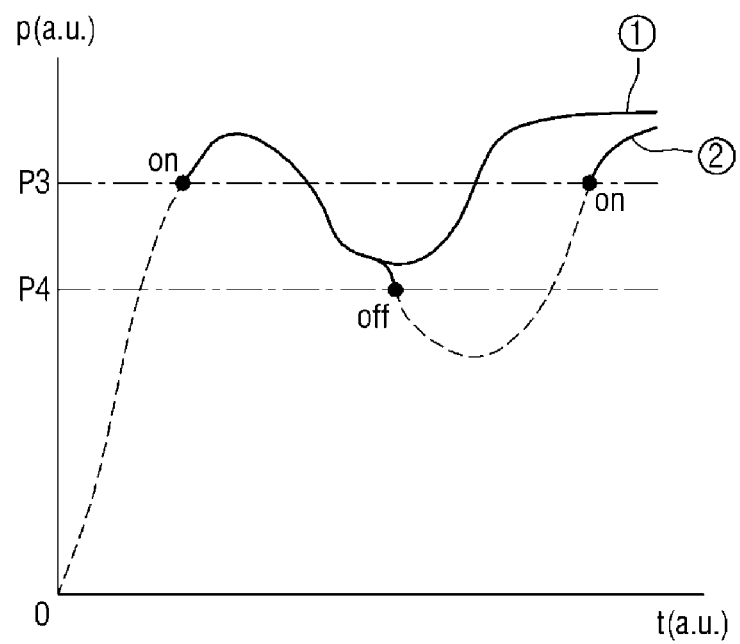
FIG. 8 is a graph provided to explain a hysteresis mode of a chuck stage particle detection device according to an exemplary embodiment of the inventive concept.

FIG. 8 is a graph provided to explain a hysteresis mode of a chuck stage particle detection device according to an exemplary embodiment of the inventive concept.

Referring to FIGS. 6 and 8, the detection module 130 operates in hysteresis mode.

In the hysteresis mode, the reference pressure includes a third reference pressure P3 and a fourth reference pressure P4. In an embodiment, the third reference pressure P3 is greater than the fourth reference pressure P4.

The third reference pressure P3 is a threshold for the detection module 130 to enter the on-mode. On the contrary, the fourth reference module P4 is a threshold for the detection module 130 to enter the off-mode. Specifically, the chuck stage particle detection device according to an exemplary embodiment operates in the on-mode when the overall pressure measured with the pressure gauge 140 has risen to exceed the third reference pressure P3. Subsequently, even when the overall pressure falls to the third reference pressure P3 or below, as long as the overall pressure is still greater than the fourth reference pressure P4, the detection module 130 continues to operate in the on-mode (case ①).

Alternatively, when the overall pressure is less than the fourth reference pressure P4, the detection module 130 is switched to the off-mode from the on-mode (case ②). In this example, even when the overall pressure increases back to the fourth reference pressure P4 or higher, the off-mode is maintained. However, when the overall pressure becomes the third reference pressure P3 or higher, the detection module 130 is switched to the on-mode from the off-mode.

The hysteresis mode of the detection module 130 may be a mode in which accuracy of particle detection is maximized. By experiments, the comparison between the window segmentation mode and the hysteresis mode indicated that the hysteresis mode exhibited higher accuracy. That is, accuracy of particle detection may be increased by setting a reference pressure for switching from the off-mode to the on-mode to be greater than a reference pressure for switching from the on-mode to the off-mode.

Since the adsorption module 120 provides vacuum pressure sequentially, a reference pressure (i.e., the third reference pressure P3 and the fourth reference pressure P4) may be properly set so that the presence or absence of a particle may be detected.

In this example, the third reference pressure P3 and the fourth reference pressure P4 may be previously-set values which are adjustable. Accordingly, the most optimum value may be set as the third reference pressure P3 and the fourth reference pressure P4 after numerous repetitions.

Unlike the window segmentation mode, the hysteresis mode may have a buffer range. That is, the mode may be switched from the off-mode to the on-mode when the overall pressure exceeds the third reference pressure P3, and in this case, the buffer range may prevent switching from the on-mode back to the off-mode when the overall pressure instantly falls below the third reference pressure P3 again. Considering that pressure is determined by minute differences of numerous variables, it is possible to increase preciseness by decreasing particle detection sensitivity of the detection module 130 with respect to a pressure change due to noise, or the like.

Likewise, once the operation is switched to the off-mode based on the fourth reference pressure P4, it is also possible to increase preciseness of particle detection of the detection module 130 by decreasing sensitivity with respect to pressure change due to noise, since the off-mode is maintained until the third reference pressure P3 regardless of whether the fourth reference pressure P4 is exceeded or not.

A chuck stage particle detection device according to an exemplary embodiment of the inventive concept will be described with reference to FIGS. 9 to 11.

Figure 9:
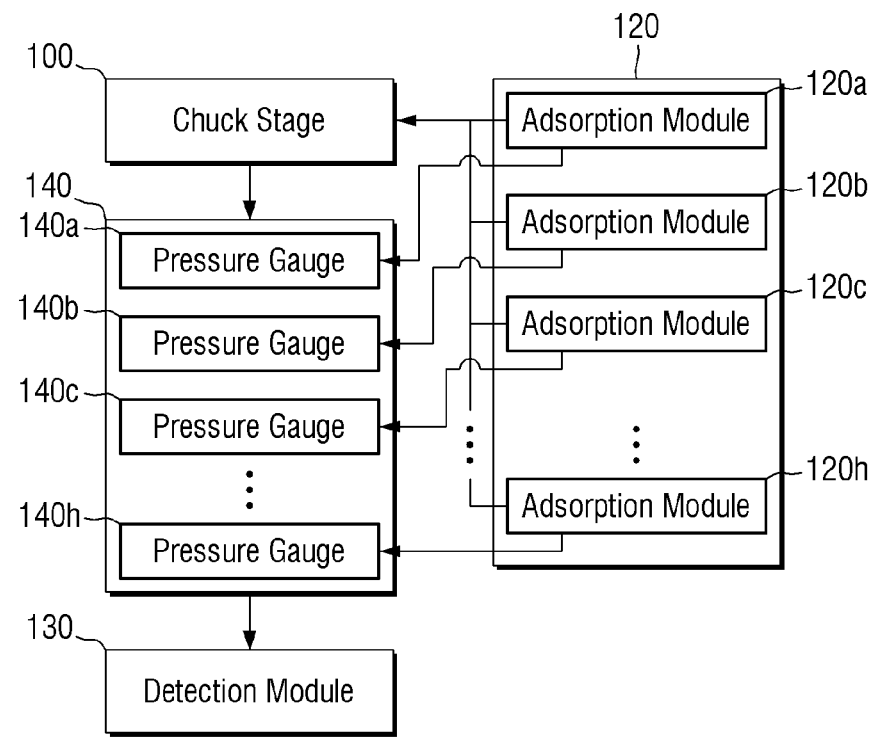
FIG. 9 is a block diagram provided to explain a chuck stage particle detection device according to an exemplary embodiment of the inventive concept.
Figure 10:
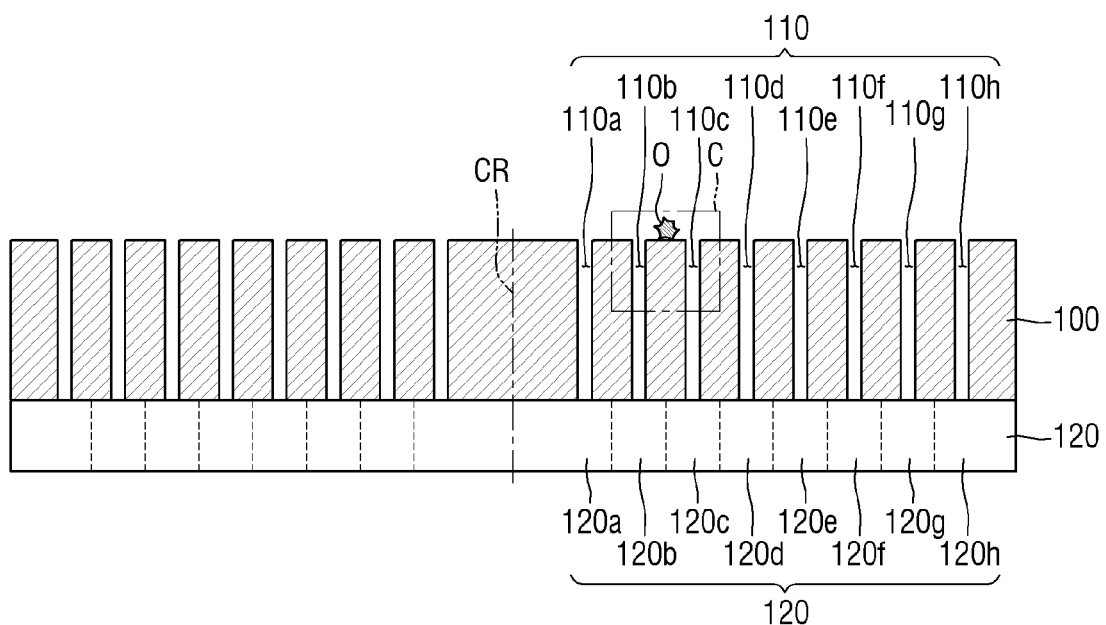
FIG. 10 is a partial cross-sectional view provided to explain the chuck stage particle detection device of FIG. 9 in detail.

FIG. 9 is a block diagram provided to explain a chuck stage particle detection device according to an exemplary embodiment of the inventive concept, and FIG. 10 is a partial cross-sectional view provided to explain the chuck stage particle detection device of FIG. 9 in detail. FIG. 11 is an enlarged cross-sectional view provided to explain the encircled section C of FIG. 10 in detail.

Referring to FIG. 9, a plurality of pressure gauges 140 is provided. Specifically, the pressure gauge 140 may include first to eighth pressure gauges 140a-140h. That is, the first to eighth pressure gauges 140a-140h may correspond to the first to eighth adsorption modules 120a-120h, respectively. That is, the first to eighth pressure gauges 140a-140h may measure pressure for the first to eighth adsorption holes 110a-110h.

In this example, there are 8 pressure gauges 140 illustrated in the drawings, but these are merely examples provided to exemplify measurement of each pressure of the first to eighth adsorption holes 110a-110h. Accordingly, exemplary embodiments of the inventive concept are not limited thereto. That is, as long as the pressure gauge 140 measures pressure of each adsorption hole 110, the number of such pressure gauges 140 is not limited.

The detection module 130 may determine the presence or absence of a particle by using pressure of the adsorption hole 110 measured by the pressure gauge 140 (i.e., by the first to eighth pressure gauges 140a-140h).

Figure 11:
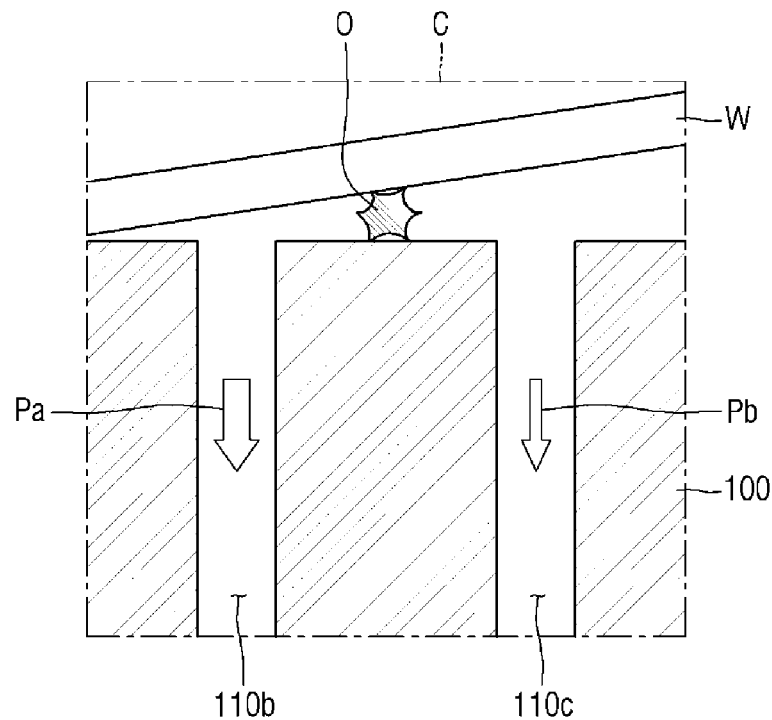
FIG. 11 is an enlarged cross-sectional view provided to explain the encircled section C of FIG. 10 in detail.

Referring to the exemplary embodiment illustrated in FIGS. 10 and 11, the detection module 130 is configured to determine a position of a particle in addition to the presence or absence of the particle. Because the adsorption module 120 provides vacuum pressure sequentially to the first to eighth adsorption holes 110a-110h, the location of the particle may be determined too.

Specifically, as illustrated, it will be exemplified herein that particle O is located between the second adsorption hole 110b and the third adsorption hole 110c. In this example, it is assumed herein that vacuum pressure is sequentially provided in a direction from the center region CR to an outer perimeter. Because vacuum pressure is sequentially provided to the adsorption holes 110, vacuum pressure is provided to the second adsorption hole 110b earlier than the third adsorption hole 110c.

The wafer W is raised higher than an upper surface of the chuck stage 100 due to the presence of the particle O, and accordingly, vacuum pressure may decrease as the adsorption hole 110 is not completely overlain by the wafer W. For example, when particle O is present, and the wafer W is placed on the chuck stage 100, a portion of the wafer W over the particle O may be positioned higher than other portions of the wafer W.

Further, because a gap becomes wider when the wafer W is risen higher than an upper surface of the chuck stage 100, a further reduced vacuum pressure may be maintained. Accordingly, a first vacuum pressure Pa provided to the second adsorption hole 110b may be less than a second vacuum pressure Pb provided to the third adsorption hole 110c. When vacuum pressure is first provided to the first adsorption hole 110a, the wafer W may be in contact with the chuck stage 100 relatively more tightly at the second adsorption hole 110b than at the third adsorption hole 110c, and may be tilted toward the second adsorption hole 110b due to the presence of the particle O.

Because of the tilt, a gap between the second adsorption hole 110b and the third adsorption hole 110c may be formed asymmetrically to each other, and the second vacuum pressure Pb formed at the third adsorption hole 110c may be further decreased.

When the first vacuum pressure Pa and the second vacuum pressure Pb are respectively compared with reference pressures, respectively, a location having a relatively lower pressure than when there is no particle may be found. In an embodiment, a particle is located between the second and third adsorption holes when the first vacuum pressure PA is less than a threshold, the first vacuum pressure PA is greater than the second vacuum pressure PB, and the second vacuum pressure PB is also less than the threshold. For example, the pressures at adsorption holes where portions of the wafer W are overlain completely flush and flat with the chuck stage may be greater than or equal the threshold.

Accordingly, the detection module 130 may determine that the particle O is located between the second adsorption hole 110b and the third adsorption hole 110c. Once the detection as described above has occurred, the particle O may be removed and the wafer W may be seated again, so that damage may be prevented in the following process and a better fabrication process may be performed.

A chuck stage particle detection device according to an exemplary embodiment of the inventive concept will be described with reference to FIG. 12.

Figure 12:
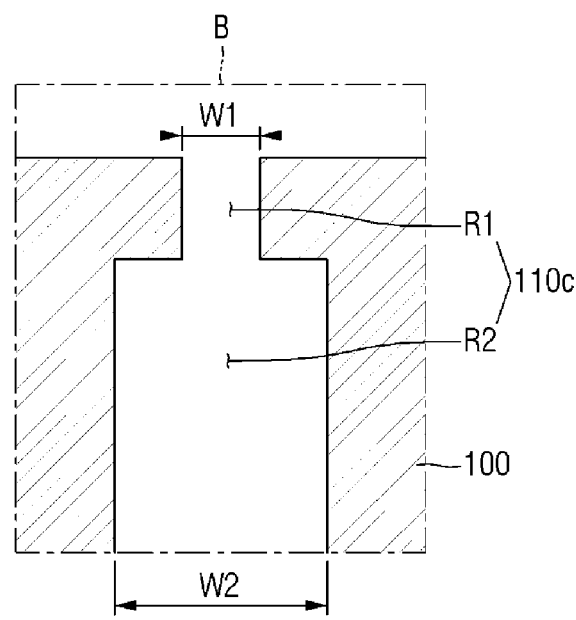
FIG. 12 is a cross-sectional view provided to explain a chuck stage particle detection device according to an exemplary embodiment of the inventive concept.

FIG. 12 is a cross-sectional view provided to explain a chuck stage particle detection device according to an exemplary embodiment of the inventive concept. Although FIG. 12 exemplifies and illustrates only the third adsorption hole 110c, the other adsorption holes 100 may have the same shape. The following description references the third adsorption hole 110c only for convenience of explanation.

Referring to FIG. 12, in the chuck stage particle detection device according to an exemplary embodiment of the inventive concept, the third adsorption hole 110c includes a first region I and a second region II.

The first region R1 may be in contact with an upper surface of the chuck stage 100. The first region R1 is a region having the first width W1. In this example, the first width W1 indicates a width in a direction from the center region CR of the chuck stage 100 toward an outer perimeter.

The second region R2 is positioned under the first region R1. In an embodiment, the second region R2 has a second width W2 greater than the first width W1 of the first region R1. Accordingly, a step difference may be formed on a boundary of the first region R1 and the second region R2 as much as the difference between the first width W1 and the second width W2.

In the chuck stage particle detection device according to an exemplary embodiment, pressure at the adsorption hole should not be too strong for particle detection at an initial process. For example, the pressure applied to the adsorption hole during particle detection is set to be less than a pre-defined first threshold. If the pressure is too high (e.g., exceeds the first threshold), it may not be possible to detect the particle.

In an embodiment, when particle detection is over, a strong fixing force is applied between the chuck stage 100 and the wafer W. Accordingly, a stronger adsorption force is required when particle detection is over. For example, the strong fixing force is achieved by applying a pressure to the adsorption hole that is higher than a pre-defined second threshold, where the first threshold is less than the second threshold.

With respect to the third adsorption hole 110c, vacuum pressure may gradually bring the wafer W into tight contact with an upper surface of the chuck stage 100, due to the second width W2 in the second region R2 being relatively greater than the first width W1 in the first region R1. When no particle is detected subsequently, the wafer W and the chuck stage 100 are brought into a tight contact with each other due to the first width. The first width W1 in the first region R1 may provide a stronger fixing force to create a tight contact since the first width W1 is narrower than the second width W2.

The chuck stage particle detection device according to an exemplary embodiment of the inventive concept may have an increased particle detection sensitivity and provide higher fixing force to the wafer W thereafter, due to the shape and widths of the third adsorption hole 110c. The shape and widths of the third adsorption hole 110c may be varied. In an embodiment, the first and second regions R1 and R2 each have a rectangular cuboid shape.

A chuck stage particle detection device according to an exemplary embodiment of the inventive concept will be described with reference to FIG. 13.

Figure 13:
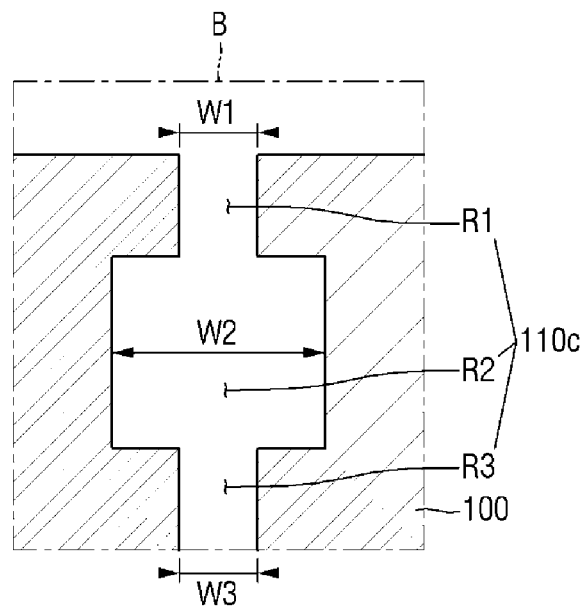
FIG. 13 is a cross-sectional view provided to explain a chuck stage particle detection device according to an exemplary embodiment of the inventive concept.

FIG. 13 is a cross-sectional view provided to explain a chuck stage particle detection device according to an exemplary embodiment of the inventive concept. Although FIG. 13 exemplifies and illustrates only the third adsorption hole 110c, the other adsorption holes 100 may have the same shape. The following will describe only the third adsorption hole 110c for convenience of explanation.

Referring to FIG. 13, the third adsorption hole 110c includes a first region R1, a second region R2, and a third region R3.

The first region R1 may be in contact with an upper surface of the chuck stage 100. The first region R1 is a region having the first width W1. In an embodiment, the first width W1 indicates a width in a direction from the center region CR of the chuck stage 100 toward an outer perimeter.

The second region R2 is positioned under the first region R1. In an embodiment, the second region R2 has a second width W2 greater than the first width W1 of the first region R1. Accordingly, a step difference may be formed on a boundary of the first region R1 and the second region R2 as much as the difference between the first width W1 and the second width W2.

The third region R3 is positioned under the second region R2. In an embodiment, the third region R3 has a third width W3 less than the second width W2 of the second region R2. Accordingly, a step difference may be formed on a boundary of the second region R2 and the third region R3 by as much as the difference between the second width W2 and the third width W3.

The chuck stage particle detection device according to an exemplary embodiment of the inventive concept further includes a third region R3 having a relatively smaller width than the second region R2 under the second region R2.

Accordingly, the chuck stage particle detection device may provide a relatively weaker adsorption force for particle detection at an initial process, and then provide a stronger fixing force, while also reducing power consumption.

That is, since the third width W3 of the third region R3 is less than the second width W2, the overall adsorption amount may be kept small. Further, despite the small adsorption amount, enhancement of both the preciseness of particle detection and fixing strength of the wafer W may be simultaneously achieved, because of difference between the widths of the second region R2 and the first region R1. That is, compared to the embodiment illustrated in FIG. 12, power consumption may be further reduced. In an embodiment, each of the first-third regions R1-R3 have a rectangular cuboid shape. In an embodiment, the first width W1 is the same as the third width W3.

A chuck stage particle detection device according to an exemplary embodiment of the inventive concept will be described with reference to FIG. 14.

Figure 14:
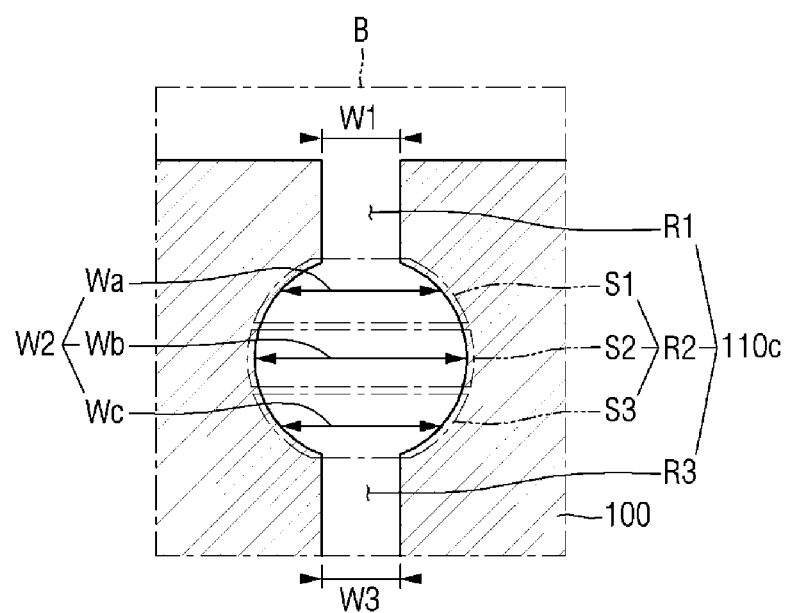
FIG. 14 is a cross-sectional view provided to explain a chuck stage particle detection device according to an exemplary embodiment of the inventive concept.

FIG. 14 is a cross-sectional view provided to explain a chuck stage particle detection device according to an exemplary embodiment of the inventive concept. Although FIG. 14 exemplifies and illustrates only the third adsorption hole 110c, the other adsorption holes 100 may have the same shape. The following will describe only the third adsorption hole 110c for convenience of explanation.

Referring to FIG. 14, the second region R2 of the third adsorption hole 110c of the chuck stage particle detection device according to an exemplary embodiment includes a first section S1, a second section S2, and a third section S3.

The first section S1 has a first section width Wa, and the second section S2 has a second section width Wb. The third section S3 may also have a separate third section width Wc. In an embodiment, the second section width Wb is greater than the first section width Wa. In an embodiment, the second section width Wb is greater than the third section width Wc.

That is, the second width W2 may include the first section width Wa, the second section width Wb and the third section width Wc. Because the second width W2 is greater than the first width W1 and the third width W3, the first section width Wa, the second section width Wb, and the third section width Wc are all greater than the first width W1 and the third width W3.

The first section S1 is positioned between the first region R1 and the second section S2. In an embodiment, a width of the first section S1 is not constant due to depth. That is, the first section width Wa of the first section S1 becomes greater as depth becomes greater. Accordingly, the first section width Wa on a boundary of the first region R1 and the first section S1 is less than the first section width Wa on a boundary of the first section S1 and the second section S2.

The third section S3 is positioned between the third region R3 and the second section S2. In an embodiment, a width of the third section S3 is not constant due to depth. That is, the third section width Wc of the third section S3 becomes smaller as depth becomes greater. Accordingly, the third section width Wc on a boundary of the third region R3 and the second section S2 is less than the third section width Wc on a boundary of the third section S3 and the second section S2.

In an embodiment, the second region R2 has a shape of a pot. In an embodiment, the second region R2 is shaped like a sphere with a top portion and a bottom portion removed.

The chuck stage particle detection device according to an exemplary embodiment of the inventive concept may adsorb air from within the adsorption hole 110 to generate vacuum pressure, and such vacuum pressure may vary according to air flow.

The adsorption hole 110 may have three regions having different widths from each other so as to provide a relatively weaker adsorption force at an initial process for particle detection, while providing a relatively stronger adsorption force in a later stage. However, when a step difference is formed due to such differences in the widths described above, a blockage may occur in the air flow, thus consuming more power for forming the same vacuum pressure.

Accordingly, in order to minimize power consumption while minutely adjusting vacuum pressure, the chuck stage particle detection device according to an exemplary embodiment of the inventive concept has a second region R2 in a circle shape and thus has an improved operating performance.

A chuck stage particle detection device according to an exemplary embodiment of the inventive concept will be described with reference to FIG. 15.

Figure 15:
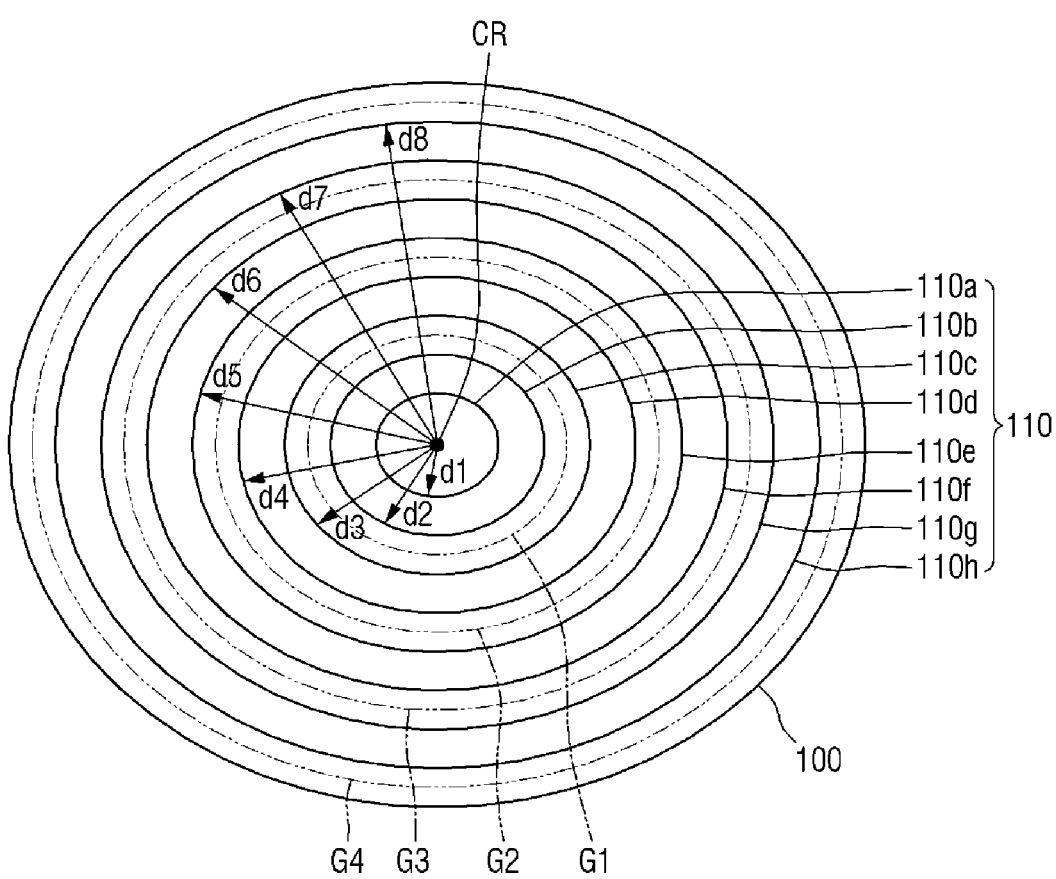
FIG. 15 is a top view provided to explain a chuck stage particle detection device according to an exemplary embodiment of the inventive concept.

FIG. 15 is a top view provided to explain a chuck stage particle detection device according to an exemplary embodiment of the inventive concept.

Referring to FIG. 15, the chuck stage 100 of the chuck stage particle detection device according to an exemplary embodiment of the inventive concept includes first to fourth group regions G1-G4.

The first group region G1 is a region including the first adsorption hole 110a and the second adsorption hole 110b from the center region CR, the second group region G2 is a region including the third adsorption hole 110c and the fourth adsorption hole 110d. Further, the third group region G3 is a region including the fifth adsorption hole 110e and the sixth adsorption hole 110f, and the fourth group region G4 is a region including the seventh adsorption hole 110g and the eighth adsorption hole 110h.

That is, the second group region G2 surrounds the first group region G1, the third group region G3 surrounds the second group region G2, and the fourth group region G4 surrounds the third group region G3. The first to fourth group regions G1-G4 may form a closed curve on a plane cross-section. Likewise, the first to eighth adsorption holes 110a-110h may form a closed curve on a plane cross-section.

The adsorption module 120 may provide vacuum pressure per group region. That is, the adsorption module 120 may first provide vacuum pressure to the first adsorption hole 110a and the second adsorption hole 110b of the first group region G1, and then through the second group region G2 and the third group region G3, and then lastly provide the vacuum pressure to the seventh adsorption hole 110g and the eighth adsorption hole 110h of the fourth group region G4.

It an alternate embodiment, of the chuck stage particle detection device, the adsorption module 120 first provides vacuum pressure to the fourth group region G4, and provides vacuum pressure in an order of the third group region G3, the second group region G2, and the first group region G1. That is, the chuck stage particle detection device according to an embodiment may be sequentially provided with vacuum pressure as described in the above embodiments.

In an embodiment, a plurality of adsorption holes 110 belonging to the respective group regions are provided with vacuum pressure simultaneously. As a result, the chuck stage particle detection device according to an exemplary embodiment may perform a particle detection process quickly, and accordingly, time consumed in the entire fabrication process can be minimized. Further, as the area fixed per stage becomes larger, fixing according to loading of the wafer W may be performed more stably.

Although the drawings illustrate that each group region includes the same number (2) of adsorption holes 110, the inventive concept is not limited thereto. According to need, the adsorption holes 110 disposed per group region may be different from each other. For example, a first one of the group regions could include only a single adsorption hole while a second one of the group regions includes three adsorption holes.

A chuck stage particle detection device according to an exemplary embodiment of the inventive concept will be described with reference to FIGS. 6 and 16.

Figure 16:
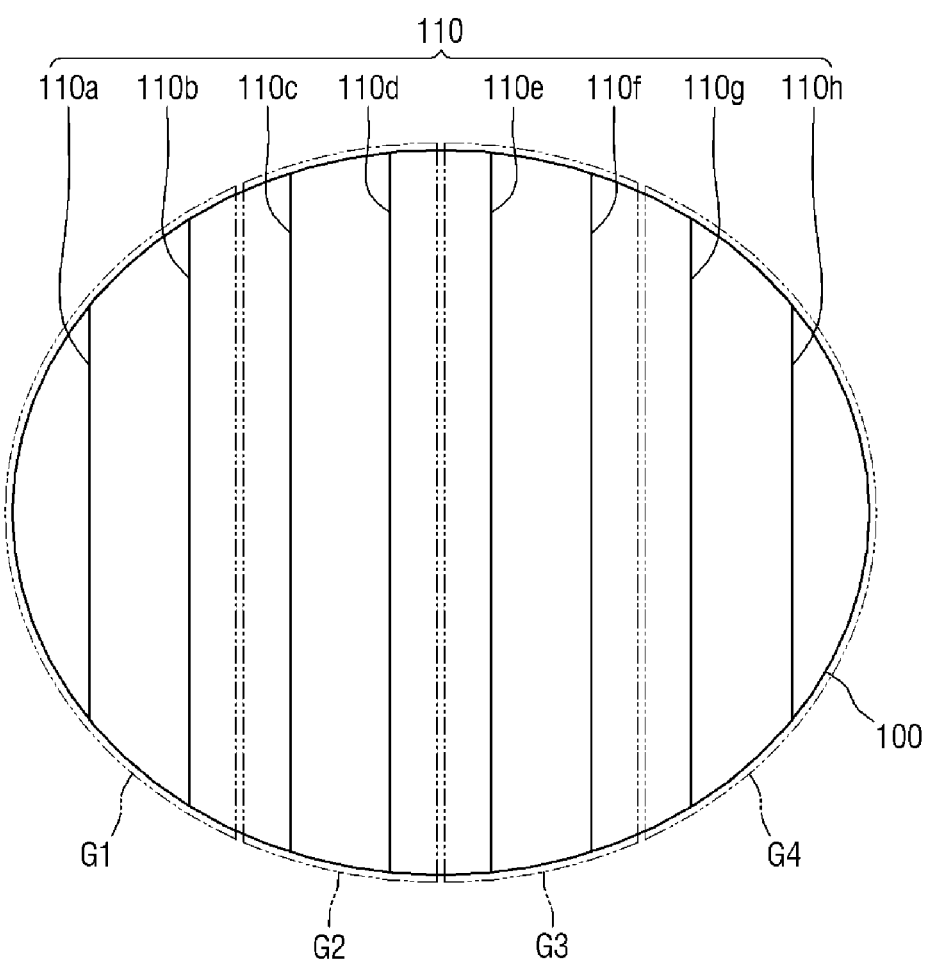
FIG. 16 is a top view provided to explain a chuck stage particle detection device according to an exemplary embodiment of the inventive concept.

FIG. 16 is a top view provided to explain a chuck stage particle detection device according to an exemplary embodiment of the inventive concept.

Referring to FIGS. 6 and 16, the chuck stage particle detection device according to an exemplary embodiment of the inventive concept includes first to fourth group regions G1-G4.

The first group region G1 includes the first adsorption hole 110a and the second adsorption hole 110b, and the second group region G2 includes the third adsorption hole 110c and the fourth adsorption hole 110d. The third group region G3 includes the fifth adsorption hole 110e and the sixth adsorption hole 110f, and the fourth group region G4 includes the seventh adsorption hole 110g and the eighth adsorption hole 110h.

In an embodiment, the first to eighth adsorption holes 110a-110h are arranged in parallel with each other in a first direction. That is, because the chuck stage 100 has an oval shape, the first to eighth adsorption holes 110a-110h may be formed in different lengths from each other. As illustrated, the fourth adsorption hole 110d and the fifth adsorption hole 110e may have a longest length, and the first adsorption hole 110a and the eighth adsorption hole 110h have a shortest length. However, the shape of the adsorption holes is not limited thereto.

For example, the first to fourth group regions G1-G4 may be disposed in parallel to side surfaces on a plane.

In an embodiment, the adsorption module 120 sequentially provides vacuum pressure to the first to fourth group regions G1-G4. For example, the adsorption module 120 may provide vacuum pressure in an order of the first group region G1, the second group region G2, the third group region G3, and the fourth group region G4. Accordingly, as contact between the wafer W and the chuck stage 100 is tightened by applying pressure to the group regions in a direction from the left side to the right side of FIG. 16, the detection module 130 may detect a particle.

In a chuck stage particle detection device according to an exemplary embodiment of the inventive concept, the adsorption module 120 provides vacuum pressure in a reverse order (i.e., in an order of the fourth group region G4, the third group region G3, the second group region G2, and the first group region G1). Accordingly, as contact between the wafer W and the chuck stage 100 is tightened by applying pressure in a direction from the right side to the left side of FIG. 16, the detection module 130 may detect a particle.

In an embodiment, a plurality of adsorption holes 110 belonging to the respective group regions are provided with vacuum pressure simultaneously. As a result, the chuck stage particle detection device according to an exemplary embodiment of the inventive concept may perform a particle detection process quickly, and accordingly, time consumed in the entire fabrication process can be minimized. Further, as the area fixed per stage becomes larger, fixing according to loading of the wafer W may be performed more stably.

Although the drawings illustrate that each group region includes a same number (2) of the adsorption holes 110, the inventive concept is not limited thereto. According to need, the adsorption holes 110 disposed per group region may be different from each other.

A chuck stage particle detection device according to an exemplary embodiment of the inventive concept will be described with reference to FIGS. 6 and 17.

Figure 17:
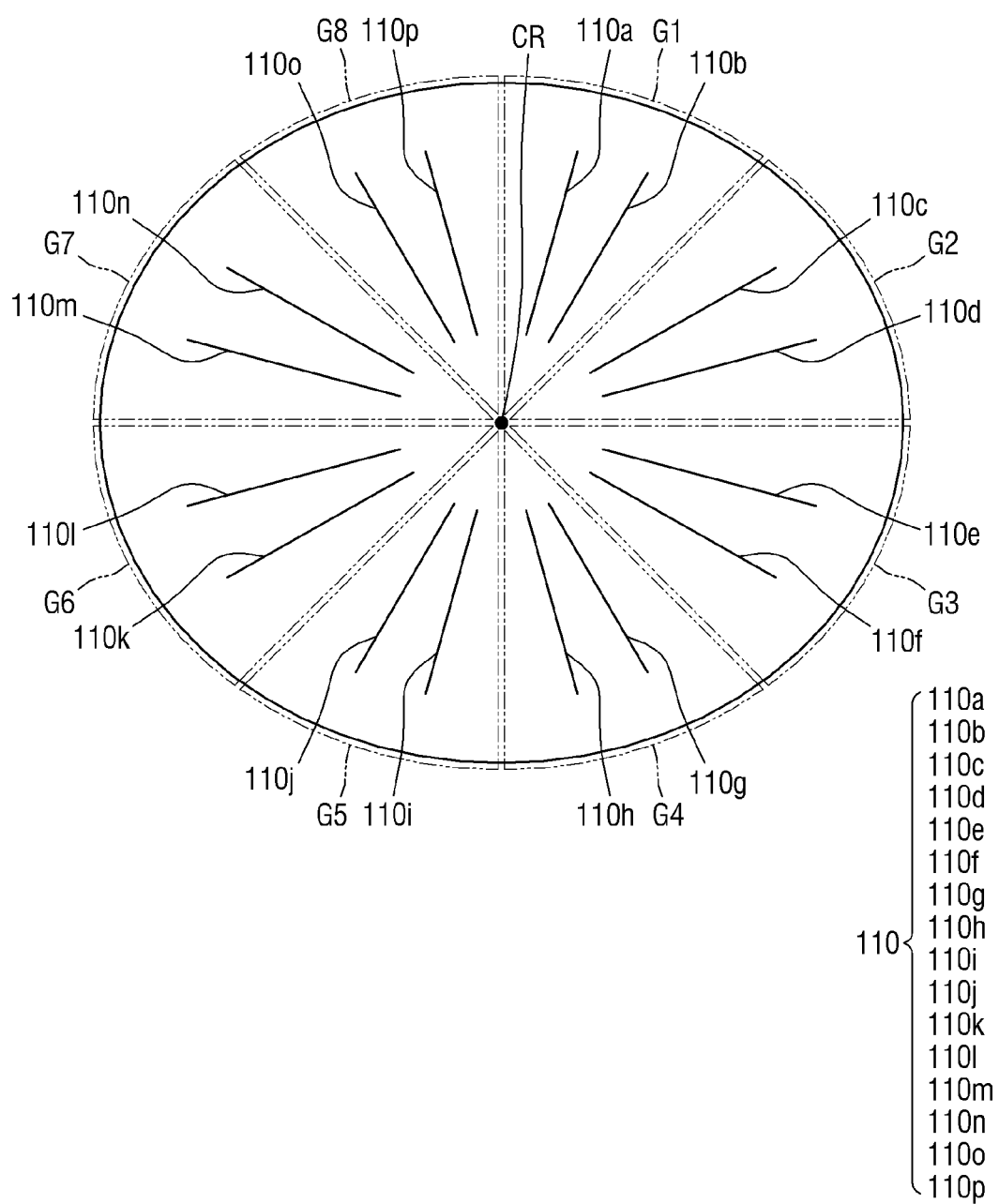
FIG. 17 is a top view provided to explain a chuck stage particle detection device according to an exemplary embodiment of the inventive concept.

FIG. 17 is a top view provided to explain a chuck stage particle detection device according to an exemplary embodiment of the inventive concept.

Referring to FIGS. 6 and 17, the chuck stage particle detection device according to an exemplary embodiment of the inventive concept includes first to eighth group regions G1-G8.

The first group region G1 includes the first adsorption hole 110a and the second adsorption hole 110b, and the second group region G2 includes the third adsorption hole 110c and the fourth adsorption hole 110d. The third group region G3 may include the fifth adsorption hole 110e and the sixth adsorption hole 110f, and the fourth group region G4 may include the seventh adsorption hole 110g and the eighth adsorption hole 110h.

The fifth group region G5 includes the ninth adsorption hole 110i and the tenth adsorption hole 110j, and the sixth group region G6 includes the eleventh adsorption hole 110k and the twelfth adsorption hole 110l. The seventh group region G7 includes the thirteenth adsorption hole 110m and the fourteenth adsorption hole 110n, and the eighth group region G8 includes the fifteenth adsorption hole 110o and the sixteenth adsorption hole 110p.

The first to eighth group regions G1-G8 may have a shape of a sector which is formed by a plurality of lines that pass through a center of the oval defined with an outer perimeter of the chuck stage 100. While 8 group regions are illustrated in FIG. 17, the inventive concept, the number of the group regions is not limited thereto.

The first to sixteenth adsorption holes 110a-110p may be divided and disposed within the first to eighth group regions G1-G8, respectively. Although the drawings illustrate that two adsorption holes 110 are uniformly disposed in one group region, the inventive concept is not limited thereto. In a chuck stage particle detection device according to an exemplary embodiment of the inventive concept, a different number of the adsorption holes 110 may be disposed in each group region. For example, each group region could include three adsorption holes, or some of the group regions could include one adsorption hole while others include three adsorption holes.

In an embodiment, the first to sixteenth adsorption holes 110a-110p have a shape of a bar. The first to sixteenth adsorption holes 110a-110p may have a shape of a bar extending from the center region CR to an outer perimeter. However, exemplary embodiments of the inventive concept are not limited to the example given above. That is, the chuck stage particle detection device according to an exemplary embodiment includes adsorption holes 110 of different shapes.

The adsorption module 120 may sequentially provide vacuum pressure to the first to eighth group regions G1-G8. For example, the adsorption module 120 may provide vacuum pressure in a clockwise order. Accordingly, while the wafer W is brought into a tight contact with the chuck stage 100 by application of pressure in a clockwise direction, the detection module 130 may detect a particle.

In a chuck stage particle detection device according to an exemplary embodiment of the inventive concept, the adsorption module 120 provides vacuum pressure in a reverse direction (i.e., in an order of counterclockwise direction). Accordingly, as the wafer W is brought into a tight contact with the chuck stage 100 by application of pressure in a counterclockwise, the detection module 130 may detect a particle.

In an exemplary embodiment, a plurality of adsorption holes 110 belonging to the respective group regions are provided with vacuum pressure simultaneously. As a result, the chuck stage particle detection device according to an exemplary embodiment of the inventive concept may perform a particle detection process quickly, and accordingly, time consumed in the entire fabrication process can be minimized. Further, as the area fixed per stage becomes larger, fixing according to loading of the wafer W may be performed more stably.

While the inventive concept has been particularly illustrated and described with reference to exemplary embodiments thereof, it will be understood by those of ordinary skill in the art that various changes in form and detail may be made therein without departing from the spirit and scope of the present inventive concept.

What is claimed is:

1. A chuck stage particle detection device, comprising:
a chuck stage on which a wafer is configured to be seated;
a first adsorption hole passing through the chuck stage, in which a plane cross-section of the first adsorption hole is a first closed curve;
a second adsorption hole passing through the chuck stage, in which a plane cross-section of the second adsorption hole is a second closed curve, and the first closed curve is positioned within the second closed curve;
a first device connected to the first adsorption hole under the chuck stage and configured to provide a vacuum pressure through the first adsorption hole;
a second device connected to the second adsorption hole under the chuck stage and configured to provide a vacuum pressure through the second adsorption hole;
a pressure gauge configured to measure vacuum pressures of the first and second adsorption holes; and
a detection circuit configured to receive the vacuum pressures of the first and second adsorption holes from the pressure gauge and detect whether the wafer is fixed or not and whether a particle is present or not, based on the received vacuum pressures, wherein the first and second devices sequentially provide the vacuum pressure to the first and second adsorption holes.

2. The chuck stage particle detection device of claim 1, wherein the detection circuit detects a presence or absence of the particle by comparing a previously determined reference pressure with the vacuum pressures of the first and second adsorption holes.

3. The chuck stage particle detection device of claim 2, wherein the detection circuit is configured to operate in one of a window segmentation mode and a hysteresis mode, wherein the window segmentation mode provides a first method for determining whether the wafer is fixed or not and whether the particle is present or not, based on the received vacuum pressures, and the hysteresis mode provides a second other method for determining whether the wafer is fixed or not and whether the particle is present or not, based on the received vacuum pressures.

4. The chuck stage particle detection device of claim 3, wherein, in the window segmentation mode, the reference pressure comprises first and second reference pressures, and the detection circuit determines that the wafer is fixed onto the chuck stage and the particle is not present, when the vacuum pressure is between the first and second reference pressures.

5. The chuck stage particle detection device of claim 3, wherein, in the hysteresis mode, the reference pressure comprises first and second reference pressures, the first reference pressure is greater than the second reference pressure, the detection circuit is switched to on-mode from off-mode when the vacuum pressure becomes greater than the first reference pressure, the detection circuit is switched to the off-mode from the on-mode when the vacuum pressure becomes less than the second reference pressure, the detection circuit determines that the wafer is fixed onto the chuck stage and the particle is not present in the on-mode, and the detection circuit determines that the wafer is not fixed onto the chuck stage and the particle is present in the off-mode.

6. The chuck stage particle detection device of claim 5, wherein the first reference pressure and the second reference pressure are adjustable.

7. The chuck stage particle detection device of claim 1, wherein the pressure gauge comprises a first pressure gauge configured to measure the vacuum pressure of the first adsorption hole, and a second pressure gauge configured to measure the vacuum pressure of the second adsorption hole.

8. The chuck stage particle detection device of claim 7, wherein the detection circuit is configured to detect a presence or absence of the particle and a position of the particle, based on the received vacuum pressures.

9. The chuck stage particle detection device of claim 8, wherein the detection circuit detects the presence or absence of the particle and the position of the particle by: comparing a first reference pressure with the vacuum pressure of the first adsorption hole, and comparing a second reference pressure with the vacuum pressure of the second adsorption hole.

10. The chuck stage particle detection device of claim 9, wherein the detection circuit determines that the particle is positioned between the first adsorption hole and the second adsorption hole, when the vacuum pressure of the first adsorption hole is greater than the first reference pressure, and the vacuum pressure of the second adsorption hole is less than the second reference pressure.

11. A chuck stage particle detection device, comprising:
a chuck stage on which a wafer is configured to be seated, and comprising a center region;
a plurality of adsorption holes passing through the chuck stage, exposed to an upper surface of the chuck stage and configured to receive a vacuum pressure to adsorb the wafer onto the upper surface of the chuck stage, wherein the plurality of adsorption holes are positioned at different distances from the center region of the chuck stage;
a pressure gauge configured to measure adsorption pressure of the plurality of adsorption holes to generate a plurality of measured adsorption pressures;
a device configured to provide the vacuum pressure to the adsorption holes, wherein the device provides the vacuum pressure sequentially to the plurality of adsorption holes in an order from the adsorption holes positioned closer to the center region to the adsorption holes positioned farther from the center region; and
a detection circuit configured to receive the measured adsorption pressures from the pressure gauge and detect a presence or absence of a particle, based on the received measured adsorption pressures.

12. The chuck stage particle detection device of claim 11, wherein a plane cross-section of each adsorption hole is a closed curve surrounding the center region.

13. The chuck stage particle detection device of claim 12, wherein a plane cross-section of each adsorption hole is a circle or an oval surrounding the center region.

14. The chuck stage particle detection device of claim 11, wherein a vertical cross-section of each adsorption hole comprises first and second regions, the first region is in contact with an upper surface of the chuck stage and has a first width, and the second region is in contact with the first region under the first region and has a second width greater than the first width.

15. The chuck stage particle detection device of claim 14, wherein the vertical cross-section of each adsorption hole further comprises a third region, and the third region is in contact with the second region under the second region, and has a third width less than the second width.

16. The chuck stage particle detection device of claim 15, wherein the second region comprises first to third sections which are positioned in an order of proximity to the first region, the second width comprises first to third section widths which are widths of the first to third sections, respectively, and the second section width is greater than the first and third section widths.

17. A chuck stage particle detection device, comprising:
a chuck stage on which a wafer is configured to be seated, and comprising first and second regions disposed in different positions from each other;
a first adsorption hole passing through the chuck stage and positioned in the first region;
a second adsorption hole passing through the chuck stage and positioned in the second region;
a pressure gauge configured to measure adsorption pressures of the first and second adsorption holes to generate a plurality of measured adsorption pressures;
a device configured to provide vacuum pressure sequentially to the first and second adsorption holes; and
a detection circuit configured to receive the measured adsorption pressures from the pressure gauge and detect a presence or absence of a particle, from the received measured adsorption pressures.

18. The chuck stage particle detection device of claim 17, wherein the second region surrounds an outer portion of the first region on a plane cross-section.

19. The chuck stage particle detection device of claim 17, wherein the first and second regions are disposed in parallel with each other.

20. The chuck stage particle detection device of claim 17, wherein a plane shape of the chuck stage is a circle or an oval shape, the first and second regions have a shape of a sector that is defined with different two lines intersecting with the circle or the oval at two points, and the device provides the vacuum pressure in a clockwise or counter-clockwise order to the first and second adsorption holes.

* * * * *